US008836341B2

(12) United States Patent
Inoue

(10) Patent No.: US 8,836,341 B2
(45) Date of Patent: Sep. 16, 2014

(54) SEMICONDUCTOR CIRCUIT, SEMICONDUCTOR DEVICE, METHOD OF DIAGNOSING ABNORMALITY OF WIRE, AND COMPUTER READABLE STORAGE MEDIUM

(75) Inventor: Kazutoshi Inoue, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 366 days.

(21) Appl. No.: 13/280,373

(22) Filed: Oct. 25, 2011

(65) Prior Publication Data

US 2012/0098547 A1 Apr. 26, 2012

(30) Foreign Application Priority Data

Oct. 26, 2010 (JP) ................................ 2010-240073

(51) Int. Cl.
*G01N 27/416* (2006.01)
*G01R 31/02* (2006.01)
*G01R 31/36* (2006.01)

(52) U.S. Cl.
CPC .......... *G01R 31/025* (2013.01); *G01R 31/3658* (2013.01)
USPC ............................ 324/434; 324/433; 324/537

(58) Field of Classification Search
CPC ............. G01R 31/3606; G01R 31/362; G01R 31/3637; G01R 31/3658; G01R 31/3696; G01R 31/026; H02J 7/0021
USPC .......................................... 324/433, 434, 537
See application file for complete search history.

(56) References Cited

U.S. PATENT DOCUMENTS

| | | | | |
|---|---|---|---|---|
| 6,639,408 | B2 * | 10/2003 | Yudahira et al. | 324/434 |
| 7,656,164 | B2 * | 2/2010 | Kawamura | 324/434 |
| 7,679,369 | B2 * | 3/2010 | Hartzog et al. | 324/426 |
| 2004/0174170 | A1 * | 9/2004 | Kim | 324/426 |
| 2008/0061764 | A1 * | 3/2008 | Tae et al. | 324/72 |
| 2008/0088279 | A1 * | 4/2008 | Lim et al. | 320/134 |
| 2009/0066338 | A1 * | 3/2009 | Yonezawa | 324/426 |
| 2009/0195213 | A1 * | 8/2009 | Li et al. | 320/136 |
| 2011/0057658 | A1 * | 3/2011 | Yugou et al. | 324/426 |

FOREIGN PATENT DOCUMENTS

| | | | |
|---|---|---|---|
| JP | 2007-010580 | A | 1/2007 |
| JP | 2009-257923 | A | 11/2009 |

* cited by examiner

*Primary Examiner* — Patrick Assouad
*Assistant Examiner* — Alexander J Nemtzow
(74) *Attorney, Agent, or Firm* — Rabin & Berdo. P.C.

(57) ABSTRACT

There is provided a semiconductor circuit including: a selection circuit, to which are connected batteries in series, and which selects any one of the batteries; a difference detecting circuit, to which voltage of a high potential side of the selected battery inputted, and to which voltage of a low potential side of the selected battery is inputted, and which outputs a difference between the voltage at the high-potential side and the voltage at the low-potential side; and a voltage applying unit that applies diagnostic voltage to a wire that is for inputting the high potential voltage to the difference detecting circuit when diagnosing an abnormality of a wire associated with the selected battery if the selected battery is a battery of a highest position in the series or a battery of a lowest position in the series.

8 Claims, 12 Drawing Sheets

FIG.4

| TERMINAL NAME | TERMINAL VOLTAGE (V) | CELL THAT IS READ | NORMAL | DISCONNECTION OF V4 | DISCONNECTION OF V3 | DISCONNECTION OF V2 | DISCONNECTION OF V1 | DISCONNECTION OF V0 |
|---|---|---|---|---|---|---|---|---|
| V4 | 14.0 | CELL 4 | 3.5 | 0 | 4.7 | 3.5 | 3.5 | 3.5 |
| V3 | 10.5 | CELL 3 | 3.5 | 3.5 | 0 | 4.7 | 3.5 | 3.5 |
| V2 | 7.0 | CELL 2 | 3.5 | 3.5 | 3.5 | 0 | 3.5 | 3.5 |
| V1 | 3.5 | CELL 1 | 3.5 | 3.5 | 3.5 | 3.5 | 0 | 1.75 |
| V0 | 0.0 | | | | | | | |

FIG.5

| TERMINAL NAME | TERMINAL VOLTAGE (V) | CELL THAT IS READ | NORMAL | SHORT CIRCUITING BETWEEN V4 AND V3 | SHORT CIRCUITING BETWEEN V3 AND V2 | SHORT CIRCUITING BETWEEN V2 AND V1 | SHORT CIRCUITING BETWEEN V1 AND V0 |
|---|---|---|---|---|---|---|---|
| V4 | 14. 0 | CELL 4 | 3. 5 | 0 | 3. 5 | 3. 5 | 3 5 |
| V3 | 10. 5 | CELL 3 | 3. 5 | 3. 5 | 0 | 3. 5 | 3. 5 |
| V2 | 7. 0 | CELL 2 | 3. 5 | 3. 5 | 3. 5 | 0 | 3. 5 |
| V1 | 3. 5 | CELL 1 | 3. 5 | 3. 5 | 3. 5 | 3. 5 | 0 |
| V0 | 0. 0 | | | | | | |

SEMICONDUCTOR CIRCUIT, SEMICONDUCTOR DEVICE, METHOD OF DIAGNOSING ABNORMALITY OF WIRE, AND COMPUTER READABLE STORAGE MEDIUM

CROSS-REFERENCE TO RELATED APPLICATION

This application is based on and claims priority under 35 USC 119 from Japanese Patent Application No. 2010-240073 filed on Oct. 26, 2010, the disclosure of which is incorporated by reference herein.

BACKGROUND

1. Technical Field

The present invention relates to a semiconductor circuit, a semiconductor device, a method of diagnosing an abnormality of a wire, and a computer readable medium, and in particular, relates to a semiconductor circuit, a semiconductor device, a method of diagnosing an abnormality of a wire, and a computer readable storage medium, for battery monitoring.

2. Related Art

A battery in which plural batteries (battery cells) are connected in series (lithium ion batteries and the like are concrete examples thereof) is generally used as a battery that has a large capacity and a high output and is used in motor driving and the like of a hybrid automobile or an electric automobile. There are known battery systems that are for monitoring and controlling the voltages of the batteries of such a battery.

A conventional battery monitoring system is structured to include a battery cell group that includes plural battery cells, and a semiconductor circuit that measures and controls the voltages of the battery cells included in the battery cell group.

In the battery monitoring system, cell voltage equalizing processing of the battery cell group (processing that makes the voltage values of the respective battery cells uniform) and charging/discharging control processing (processing that controls the charging and discharging of the respective battery cells), and the like are carried out on the basis of voltage information of the respective battery cells that is obtained from the semiconductor circuit for measurement. In such a battery monitoring system, when disconnection or short circuiting occurs at the wires that connect the battery cells and the semiconductor circuit for measurement, there are cases in which problems arise in the battery monitoring system. In such cases, repair must be carried out, but, when repairing the battery monitoring system, it is necessary to know in advance which of disconnection or short circuiting of a wire has occurred, in consideration of expediency of analysis.

For example, the technique disclosed in Japanese Patent Application Laid-Open (JP-A) No. 2007-10580 and the technique disclosed in JP-A No. 2009-257923 are examples of techniques that diagnose disconnection of wires that connect a battery cell group and a semiconductor circuit for measurement in a battery monitoring system.

A technique of diagnosing disconnection and short circuiting of wires relating to battery cells in such a conventional battery monitoring system is described. FIG. 12 is a circuit diagram showing an example of the schematic structure of the conventional battery monitoring system. A battery monitoring system 100 shown in FIG. 12 is structured to include a battery cell group 112 in which four cells C1 through C4 are connected in series, and a semiconductor circuit 114 for voltage measurement of the battery cell group 112. The semiconductor circuit 114 is structured to include a cell selection SW

120 that selects one battery cell (cell C1 through C4) from the battery cell group 112, and a level shifter 122 that outputs voltage Vout that is obtained by the voltage of the battery cell (cell C1 through C4) selected by the cell selection SW 120 being level-shifted to a voltage of the same potential as the low potential side of the lowest position cell C1.

In the battery monitoring system 100, when measuring the voltage of the cell C1 through C4, at the cell selection SW 120 of the semiconductor circuit 114, the switch corresponding to the potential of the high potential side and the switch corresponding to the potential of the low potential side of the battery cell to be measured (any one of the cells C1 through C4) are turned on, the potential of the high potential side is inputted to the non-inverting terminal of the level shifter 122, the potential of the low potential side is inputted to the inverting terminal, and the difference between the potential of the high potential side and the potential of the low potential side is outputted from the level shifter 122 as output voltage Vout. By comparing that output voltage Vout with a reference voltage, it is judged whether or not the battery cell voltage is maintained at a desired value. Further, on the basis of the results of this judgment, charging/discharging of voltage is carried out on the battery cell by a circuit or the like that is provided separately from the semiconductor circuit 114.

In the battery monitoring system 100, when carrying out abnormality diagnosis that senses disconnection and short-circuiting as abnormalities of the wires relating to the cells C1 through C4, relationships of correspondence (see FIG. 4) between places where disconnection of the respective cells C1 through C4 (wires V1 through V4) occurs and the output voltage Vout outputted from the level shifter 122, and relationships of correspondence (see FIG. 5) between places where short circuiting arises at the respective cells C1 through C4 (the wires V1 through V4) and the output voltage Vout outputted from the level shifter 122, are obtained in advance. One of the cells C1 through C4 is successively selected at the cell selection SW 120, and, on the basis of the output voltage Vout from the level shifter 122 and the aforementioned relationships of correspondence, it is sensed which of disconnection or short circuiting has occurred, and the place where the disconnection or short circuiting has occurred is sensed.

However, in the aforementioned abnormality diagnosing technique, as shown in FIG. 4 and FIG. 5, the detection results of disconnection and the detection results of short circuiting are the same at the battery cell of the highest position (the highest potential side) and the battery cell of the lowest position (the lowest potential side), and disconnection and short circuiting cannot be distinguished. Therefore, there is the problem that disconnection and short circuiting of the wires relating to the battery cells cannot be diagnosed appropriately.

SUMMARY

The present invention is proposed in order to overcome the above-described problem, and an object thereof is to provide a semiconductor circuit, a semiconductor device, a method of diagnosing an abnormality of a wire, and a computer readable storage medium that can appropriately diagnose disconnection and short circuiting of wires relating to a battery.

In accordance with the present invention, there is the effect that disconnection and short circuiting of wires relating to a battery can be diagnosed appropriately.

BRIEF DESCRIPTION OF THE DRAWINGS

Exemplary embodiments of the present invention will be described in detail based on the following figures, wherein:

FIG. 4 is an explanatory diagram for explaining concrete examples of relationships of correspondence of voltages when disconnection occurs;

FIG. 5 is an explanatory diagram for explaining concrete examples of relationships of correspondence of voltages when short circuiting occurs;

DETAILED DESCRIPTION

First Exemplary Embodiment

A battery monitoring system of a first exemplary embodiment of the present invention is described in detail hereinafter with reference to the drawings.

Figure 1:
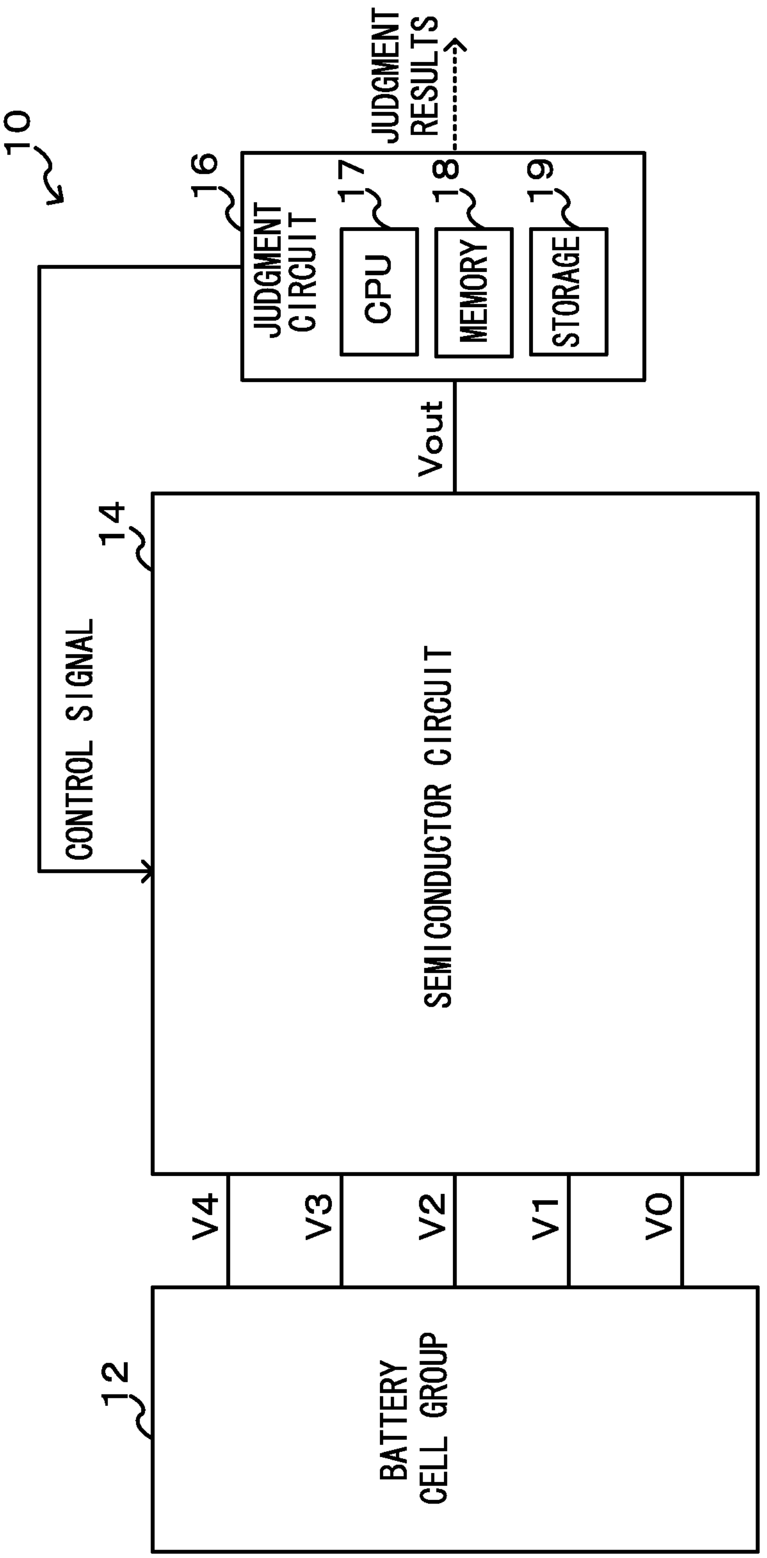
FIG. 1 is a circuit diagram showing an example of the schematic structure of a battery monitoring system relating to a first exemplary embodiment.

First, the structure of the battery monitoring system of the present exemplary embodiment is described. An example of the schematic structure of the battery monitoring system of the present exemplary embodiment is shown in FIG. 1. The battery monitoring system of the present exemplary embodiment shown in FIG. 1 is structured to include a battery cell group 12 that includes plural battery cells, a semiconductor circuit 14 that measures the voltages of the respective battery cells of the battery cell group 12, and a judgment circuit 16.

The judgment circuit 16 has the function of diagnosing abnormalities relating to the wires of the battery cells, by judging disconnection and short circuiting of wires V0 through V4 on the basis of output voltage Vout outputted from the semiconductor circuit 14. In the present exemplary embodiment, the judgment circuit 16 is structured to include a microcomputer, and is structured to include a CPU (Central Processing Unit) 17, a memory 18 including a ROM and a RAM, and a non-volatile storage 19 formed from a flash memory or the like. Relationships of correspondence (voltage distributions) for judging disconnection/short circuiting are stored in advance in the storage 19. The judgment circuit 16 has the functions of, due to the CPU 17 executing a program stored in the memory 18, outputting a control signal for disconnecting/short circuiting a wire (details described later), and carrying out judgment of disconnection/short circuiting on the basis of the relationships of correspondence (details described later).

Figure 2:
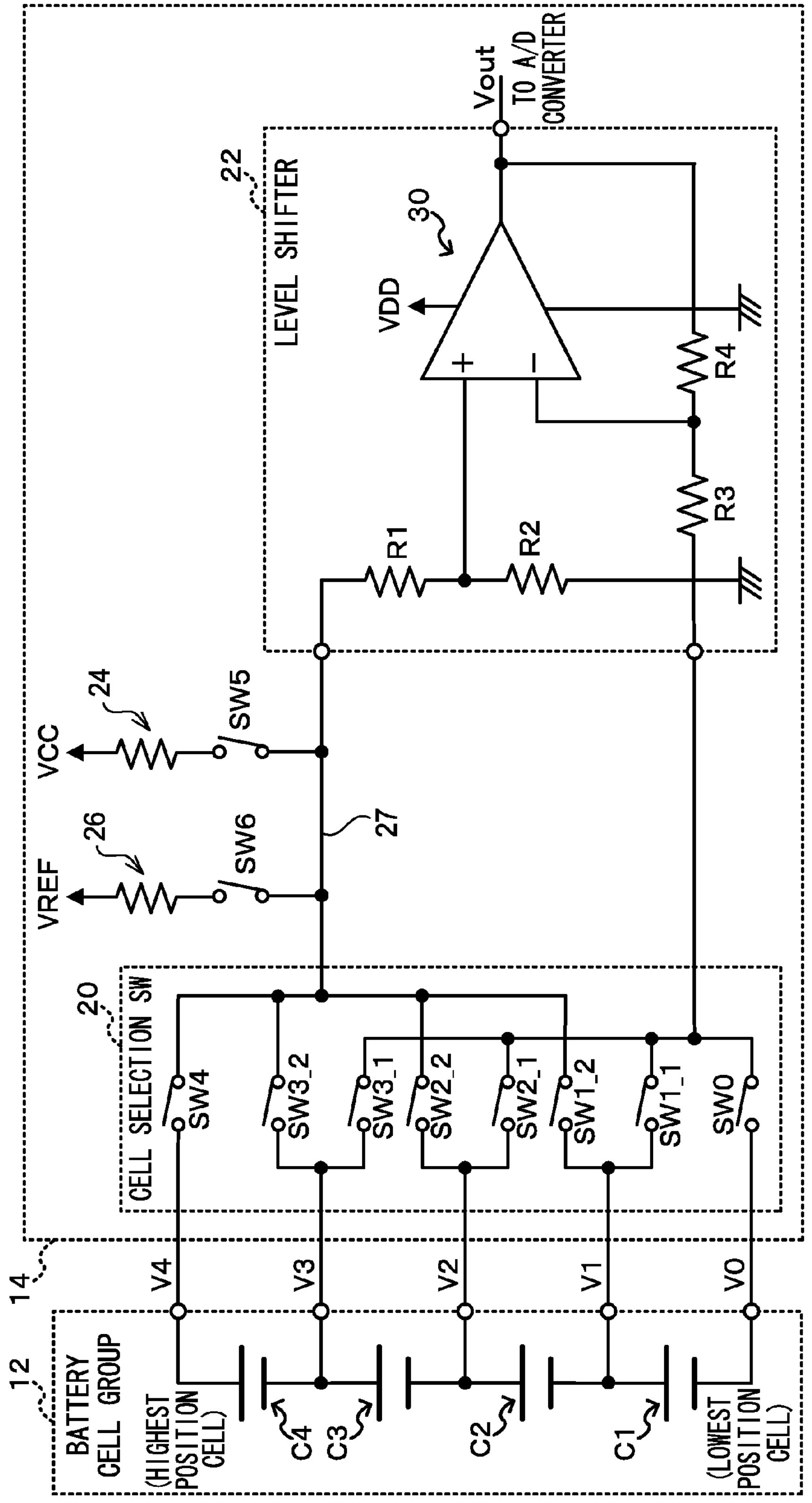
FIG. 2 is a circuit diagram showing an example of the schematic structure of a semiconductor circuit relating to the first exemplary embodiment.

An example of a schematic structure of the semiconductor circuit 14 of the present exemplary embodiment is shown in FIG. 2. Note that, in the present exemplary embodiment, as a concrete example, the battery cell group 12 includes four cells C (C1 through C4) whose voltage values are set to 3.5 V, and the voltage value of the low potential side of the lowest position cell C1 is ground level (0 V).

The semiconductor circuit 14 shown in FIG. 2 is structured to include a cell selection SW 20, a level shifter 22, and voltage applying sections 24, 26. The cell selection SW 20 has the function of, on the basis of an inputted control signal, switching internal switches SW (SW0 through SW4) and selecting the designated cell C (C1 through C4).

The level shifter 22 is structured to include resistors R1 through R4 and a level shifter amplifier 30 (hereinafter called level shifter 30). The potential of the high potential side (high potential voltage) of the cell C (C1 through C4) selected by the cell selection SW 20 is inputted to the non-inverting terminal of the level shifter 30, and the potential of the low potential side (low potential voltage) is inputted to the inverting terminal, and the difference between the high potential voltage and the low potential voltage is outputted as output voltage Vout. Note that the output voltage Vout that is outputted from the level shifter 22 is converted into a digital value by an unillustrated A/D (analog/digital) converter, and is outputted to the exterior of the semiconductor circuit 14. The output voltage Vout, that has been converted into a digital value by the A/D converter, is inputted to the judgment circuit 16 shown in FIG. 1.

In the present exemplary embodiment, as a concrete example, the level shifter 30 of the level shifter 22 uses an operational amplifier whose driving voltage is from ground level (0 V) to VDD (4.7 V), and further, the resistance values of the resistors R1 through R4 are the same value.

The voltage applying sections 24, 26 have the function of applying voltage to a wire 27 that is for inputting the high potential voltages of the respective cells C (C1 through C4) to the non-inverting terminal of the level shifter 30. As clearly illustrated in FIG. 2, each of the voltage applying sections 24, 26 is connected to the wire 27 via a node on the wire 27. When judgment of disconnection/short circuiting of the cell C4 is carried out, switch SW 5 of the voltage applying section 24 is turned on by a control signal inputted from the judgment circuit 16, and the voltage applying section 24 has the function of applying voltage VCC to the wire 27. Note that, in the present exemplary embodiment, as an example, the voltage VCC is the voltage value of the high potential side of the highest position cell (cell C4) of the battery cell group 12.

When judgment of disconnection/short circuiting of the cell C1 is carried out, switch SW 6 of the voltage applying section 26 is turned on by a control signal inputted from the judgment circuit 16, and the voltage applying section 26 has the function of applying voltage VREF to the wire 27. Note that, in the present exemplary embodiment, as an example, the voltage VREF is 4.7 V that is the reference voltage of the A/D converter at the stage after the level shifter 22 (the driving voltage of the level shifter 22).

The abnormality diagnosing operation that carries out judgment of disconnection/short circuiting of the cells C1 through C4 (wires V1 through V4) by using the semiconductor circuit 14 of the present exemplary embodiment, is described next. Examples of disconnection/short circuiting of the wires V1 through V4 are a case in which the disconnection/short circuiting arises at the interior of the battery cell group 12, a case in which the disconnection/short circuiting arises at the interior of the semiconductor circuit 14, a case in which the disconnection/short circuiting arises at the connection terminals that connect the battery cell group 12 and the semiconductor circuit 14, and the like. However, generally, it is often the case that the disconnection/short circuiting arises at the connection terminals that connect the battery cell group 12 and the semiconductor circuit 14.

Figure 3:
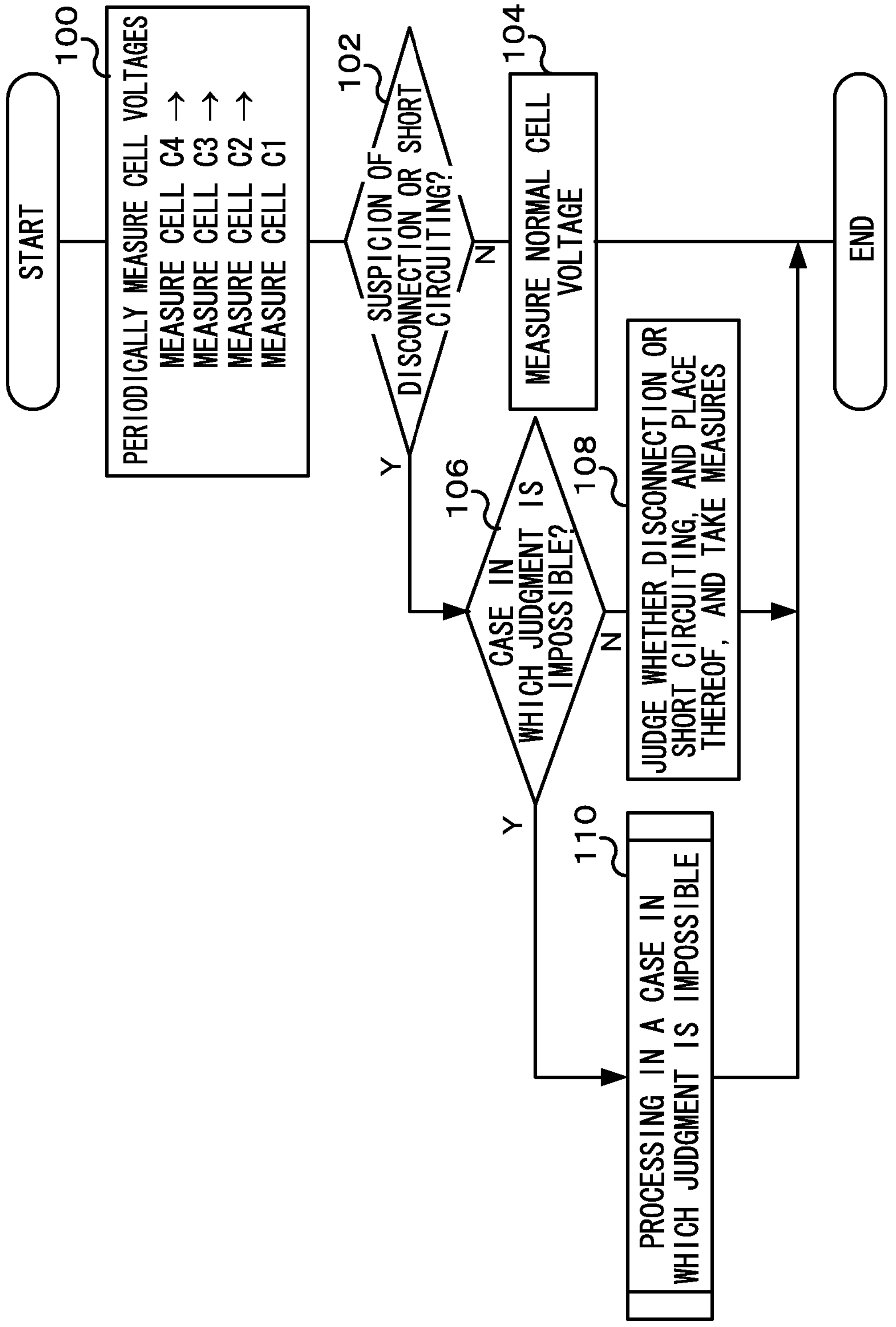
FIG. 3 is a flowchart showing an example of the flow of abnormality diagnosing operation relating to the first exemplary embodiment.

A flowchart of an example of the flow of abnormality diagnosing operation of the present exemplary embodiment is shown in FIG. 3. At the time of carrying out the abnormality diagnosing operation, a program that is stored in advance in a predetermined region of the memory 18 is executed by the CPU 17 at the judgment circuit 16. Note that, in the initial state, the switch SW 5 of the voltage applying section 24 and the switch SW 6 of the voltage applying section 26 are off.

In step 100, measurement of the respective cell voltages of the cells C1 through C4, that is carried out periodically at a battery monitoring system 10, is carried out. In the present exemplary embodiment, the cell selection SW 20 successively selects the cell C, starting from the cell C4, and the output voltage Vout is outputted from the level shifter 22. Concretely, first, switches SW 4, SW 3_1 of the cell selection SW 20 are turned on, the other switches SW are turned off, the high potential voltage (voltage V4) of the cell C4 is inputted to the non-inverting terminal of the level shifter 30, the low potential voltage (voltage V3) is inputted to the inverting terminal, and voltage V4-V3 is outputted from the level shifter 22 as the output voltage Vout. Next, switches SW 3_2, SW 2_1 of the cell selection SW 20 are turned on, the other switches SW are turned off, the high potential voltage (voltage V3) of the cell C3 is inputted to the non-inverting terminal of the level shifter 30, the low potential voltage (voltage V2) is inputted to the inverting terminal, and voltage V3-V2 is outputted from the level shifter 22 as the output voltage Vout. Next, switches SW 2_2, SW 1_1 of the cell selection SW 20 are turned on, the other switches SW are turned off, the high potential voltage (voltage V2) of the cell C2 is inputted to the non-inverting terminal of the level shifter 30, the low potential voltage (voltage V1) is inputted to the inverting terminal, and voltage V2-V1 is outputted from the level shifter 22 as the output voltage Vout. Further, switches SW 1_2, SW 0 of the cell selection SW 20 are turned on, the other switches SW are turned off, the high potential voltage (voltage V1) of the cell C1 is inputted to the non-inverting terminal of the level shifter 30, the low potential voltage (voltage V0=0 V) is inputted to the inverting terminal, and voltage V1-V0 is outputted from the level shifter 22 as the output voltage Vout.

In next step 102, it is judged whether or not there is the suspicion of disconnection or short circuiting. For example, if the results of measurement in above step 100 are 3.5 V that is the set value of all of the cells C (or are voltage values within a predetermined range in the vicinity of 3.5 V), disconnection or short circuiting has not arisen at any of the cells C, and therefore, the judgment is negative. Note that the judgment as to whether it is suspected that disconnection or short circuiting has arisen may be made on the basis of the tables of the relationships of correspondence of voltages in cases in which a disconnection has arisen and the relationships of correspondence of voltages in cases in which short circuiting has arisen, that are shown in FIG. 4 and FIG. 5 and are described hereafter.

When the judgment is negative, the routine moves on to step 104 where, because neither disconnection or short circuiting has occurred, the measurements of the cell voltages carried out in step 100 are made to be the normal cell voltage measurements, and the present processing ends.

On the other hand, when there is the suspicion of disconnection or short circuiting, the judgment is affirmative and the routine moves on to step 106. In step 106, it is judged whether or not there is a case in which judgment is impossible, in which it is impossible to judge whether the abnormality that has occurred is disconnection or short circuiting.

Here, the relationships of correspondence of voltages in cases in which disconnection has arisen and the relationships of correspondence of voltages in cases in which short circuiting has arisen, at the wires V1 through V4, are described.

First, the relationships of correspondence of voltages in cases in which disconnection has arisen at the wires V1 through V4 is described. The relationships of correspondence of the voltages (the voltage distributions) when disconnection has arisen at the respective wires V1 through V4 are shown in FIG. 4. In a case in which the wire V4 is disconnected, when the cell C4 is read (measured), because the wire at the side (high potential side) that is connected to the non-inverting terminal of the level shifter 30 is disconnected, the output voltage Vout becomes the abnormal value of output voltage Vout=0 V.

Further, in a case in which the wire V3 is disconnected, when the cell C4 is measured, 7 V, that is obtained by the voltage V4 (14 V) being resistively divided by the resistors R1, R2, is applied to the non-inverting terminal of the level shifter 30, and the wire at the side (low potential side) that is connected to the inverting terminal of the level shifter 30 is disconnected, and therefore, the output voltage Vout becomes the abnormal value of output voltage Vout=4.7 V that is the maximum output value of the level shifter 30. On the other hand, when the cell C3 is measured, the wire at the side (high potential side) that is connected to the non-inverting terminal of the level shifter 30 is disconnected, and therefore, the output voltage Vout becomes the abnormal value of output voltage Vout=0 V. Similarly, in a case in which the wire V2 is disconnected, when the cell C3 is measured, 5.25 V, that is obtained by the voltage V3 (10.5 V) being resistively divided by the resistors R1, R2, is applied to the non-inverting terminal of the level shifter 30, and the wire at the side (low potential side) that is connected to the inverting terminal of the level shifter 30 is disconnected, and therefore, the output voltage Vout becomes the abnormal value of output voltage Vout=4.7 V that is the maximum output value of the level shifter 30. On the other hand, when the cell C2 is measured, the wire at the side (high potential side) that is connected to the non-inverting terminal of the level shifter 30 is disconnected, and therefore, the output voltage Vout becomes the abnormal value of output voltage Vout=0 V.

Further, in a case in which the wire V1 is disconnected, when the cell C2 is measured, differently than the above-described cases in which the wires V2 through V4 are disconnected, 3.5 V, that is obtained by the voltage V2 (7 V) being resistively divided by the resistors R1, R2, is applied to the non-inverting terminal of the level shifter 30, and the wire at the side (low potential side) that is connected to the inverting terminal of the level shifter 30 is disconnected, and therefore, the output voltage Vout becomes output voltage Vout=3.5 V. In this way, differently than the above-described cases, the voltage value that is inputted to the non-inverting terminal of the level shifter 30 is lower than the driving voltage (4.7 V) of the level shifter 30, and therefore, because the inputted voltage value is outputted as the output voltage Vout, it cannot be judged to be an abnormal value as is. On the other hand, when the cell C1 is measured, in the same way as the above-described cases in which the wires V2 through V4 are disconnected, the wire at the side (high potential side) that is connected to the non-inverting terminal of the level shifter 30 is disconnected, and therefore, the output voltage Vout becomes the abnormal value of output voltage Vout=0 V.

Further, in a case in which the wire V0 is disconnected, when the cell C1 is measured, differently than the above-described cases in which the wires V2 through V4 are disconnected, 1.75 V, that is obtained by the voltage V1 (3.5 V) being resistively divided by the resistors R1, R2, is applied to the non-inverting terminal of the level shifter 30, and the wire at the side (low potential side) that is connected to the inverting terminal of the level shifter 30 is disconnected, and therefore, the output voltage Vout becomes the abnormal value of output voltage Vout=1.75 V. In this way, differently than the above-described cases, because the voltage value that is inputted to the non-inverting terminal of the level shifter 30 is lower than the driving voltage (4.7 V) of the level shifter 30, the inputted voltage value is outputted as the output voltage Vout, and because it is lower than the normal value (3.5 V), it can be judged to be an abnormal value.

Next, the relationships of correspondence of voltages in cases in which short circuiting has arisen at the wires V1 through V4 is described. The relationships of correspondence of the voltages (the voltage distributions) when short circuiting has arisen between the respective wires V1 through V4 are shown in FIG. 5. In a case in which short circuiting has arisen between the wires V4 and V3, when the cell C4 is read, the non-inverting terminal side (the high potential side) and the inverting terminal side (the low potential side) of the level shifter 30 are short circuited, and therefore, the output voltage Vout becomes the abnormal value of output voltage Vout=0 V. Similarly, in a case in which short circuiting has arisen between the wires V3 and V2, the output voltage Vout when the cell C3 is read becomes output voltage Vout=0 V. In a case in which short circuiting has arisen between the wires V2 and V1, the output voltage Vout when the cell C2 is read becomes output voltage Vout=0 V. In a case in which short circuiting has arisen between the wires V1 and V0, the output voltage Vout when the cell C1 is read becomes output voltage Vout=0 V.

Namely, as shown in FIG. 4 and FIG. 5, disconnection of the wire V3 can be judged in accordance with whether or not the output voltage Vout=4.7 V when the cell C4 is read. Further, disconnection of the wire V2 can be judged in accordance with whether or not the output voltage Vout=4.7 V when the cell C3 is read. Moreover, disconnection of the wire V0 can be judged in accordance with whether or not the output voltage Vout=1.75 V when the cell C1 is read. On the other hand, whether short circuiting has arisen between the wires V3 and V2 can be judged in accordance with whether or not the output voltage Vout=0 V when the wire V3 is not disconnected (the output voltage Vout at the time of reading the cell C4 is output voltage Vout≠4.7 V) and the cell C3 is read. Further, whether short circuiting has arisen between the wires V2 and V1 can be judged in accordance with whether or not the output voltage Vout=0 V when the wire V2 is not disconnected (the output voltage Vout at the time of reading the cell C3 is output voltage Vout≠4.7 V) and the cell C2 is read.

However, as shown in FIG. 4 and FIG. 5, the output voltages Vout when the cells C1 through C4 are read are all the same in a case in which the wire V4 is disconnected and in a case in which short circuiting has arisen between the wires V4 and V3. Therefore, it is impossible to judge which abnormality among the wire V4 being disconnected and short circuiting between the wires V4 and V3 has arisen. Similarly, the output voltages Vout when the cells C1 through C4 are read are all the same in a case in which the wire V1 is disconnected and in a case in which short circuiting has arisen between the wires V1 and V0. Therefore, it is impossible to judge which abnormality among the wire V1 being disconnected and short circuiting between the wires V1 and V0 has arisen. In the present exemplary embodiment, both of these cases in which judgment is impossible are called cases in which judgment is impossible.

Thus, in step 106, on the basis of FIG. 4 and FIG. 5, it is judged whether or not the current case is a case in which judgment is impossible. If the current case is not a case in which judgment is impossible, the judgment of step 106 is negative and the routine moves on to step 108 where, on the basis of FIG. 4 and FIG. 5, which place is disconnected or which place has short circuited is judged. After predetermined measures are taken in accordance with the abnormality that has arisen (the disconnection or short circuiting), the present processing ends.

On the other hand, when the current case is a case in which judgment is impossible, the judgment of step 106 is affirmative and the routine moves on to step 110 where processing in a case in which judgment is impossible, that will be described in detail hereafter, is carried out, and it is judged which of disconnection or short circuiting has arisen and measures are taken with respect thereto, and thereafter, the present processing ends.

Figure 6:
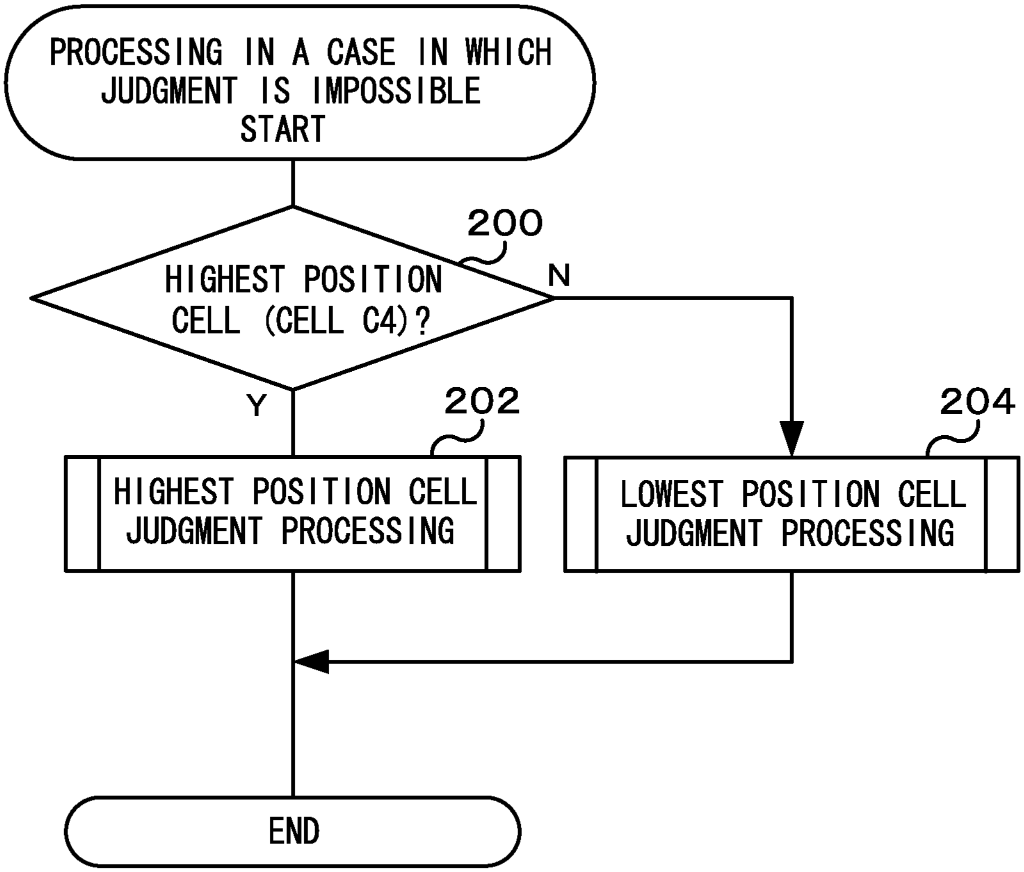
FIG. 6 is a flowchart showing an example of the flow of processing in a case in which judgment is impossible, relating to the first exemplary embodiment.
Figure 7:
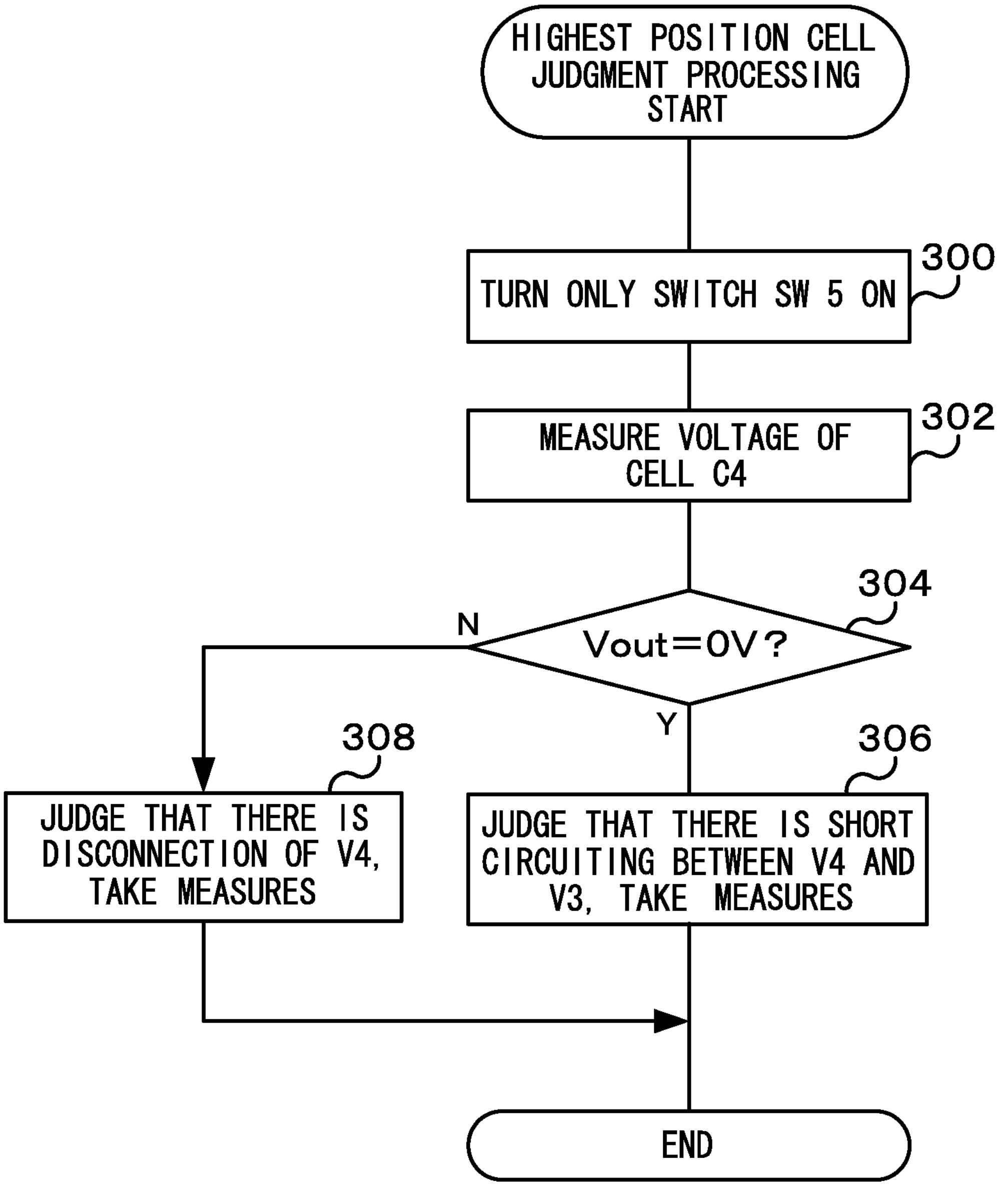
FIG. 7 is a flowchart showing an example of the flow of highest position cell judgment processing relating to the first exemplary embodiment.

Processing in a case in which judgment is impossible (step 110 of FIG. 3) is described in detail. A flowchart of an example of processing in a case in which judgment is impossible is shown in FIG. 6. In step 200, when it is judged that the abnormality for which judgment is impossible has arisen at the highest position cell C (cell C4), i.e., when it is impossible to judge whether the wire V4 is disconnected or short circuiting has arisen between the wires V4 and V3, the judgment of step 200 is affirmative and the routine moves on to step 202. In step 202, highest position cell judgment processing that is described in detail hereinafter is carried out, and it is judged whether the wire V4 is disconnected or there is short circuiting between wires V4 and V3, and, after measures corresponding to the results of judgment are carried out, the present processing ends. A flowchart of an example of the highest position cell judgment processing of step 202 is shown in FIG. 7. First, in step 300, only the switch SW 5 of the voltage applying section 24 is turned on, and the voltage VCC is supplied to the wire 27 via the switch SW 5. Note that, although the voltage VCC is supplied in the present exemplary embodiment, the voltage that is supplied is not limited to this, and is not particularly limited provided that it is a voltage whose voltage value exceeds the voltage V3. Note that, if the voltage value of the voltage that is supplied is less than or equal to the voltage V3, judgment becomes impossible because the output voltage Vout of the level shifter 30 is always Vout=0 V.

In next step 302, the cell C4 is selected at the cell selection SW 20, and the voltage value (the output voltage Vout) of the cell C4 is measured. In next step 304, it is judged whether or not the output voltage Vout=0 V. If short circuiting has arisen between the wires V4 and V3, the voltage VCC is inputted to both the non-inverting terminal and the inverting terminal of the level shifter 30, and therefore, the output voltage Vout becomes Vout=0 V. On the other hand, if the wire V4 is disconnected, the voltage VCC is inputted to the non-inverting terminal of the level shifter 30 and the voltage V3 is inputted to the inverting terminal, and therefore, the output voltage Vout becomes Vout=voltage VCC−V3. Note that, when the voltage VCC−V3 exceeds the maximum output voltage 4.7 V of the level shifter 30, the output voltage Vout becomes Vout=4.7 V. Therefore, when the output voltage Vout=0 V (or a voltage value within a predetermined range from 0 V), the judgment in step 304 is affirmative, and the routine proceeds to step 306 where it is judged that there is short circuiting between the wires V4 and V3, and predetermined measures are carried out, and thereafter, the present processing ends.

On the other hand, when the output voltage Vout does not equal 0 V, the judgment in step 304 is negative. The routine moves on to step 308 where it is judged that the wire V4 is disconnected, and predetermined measures are carried out, and thereafter, the present processing ends.

Figure 8:
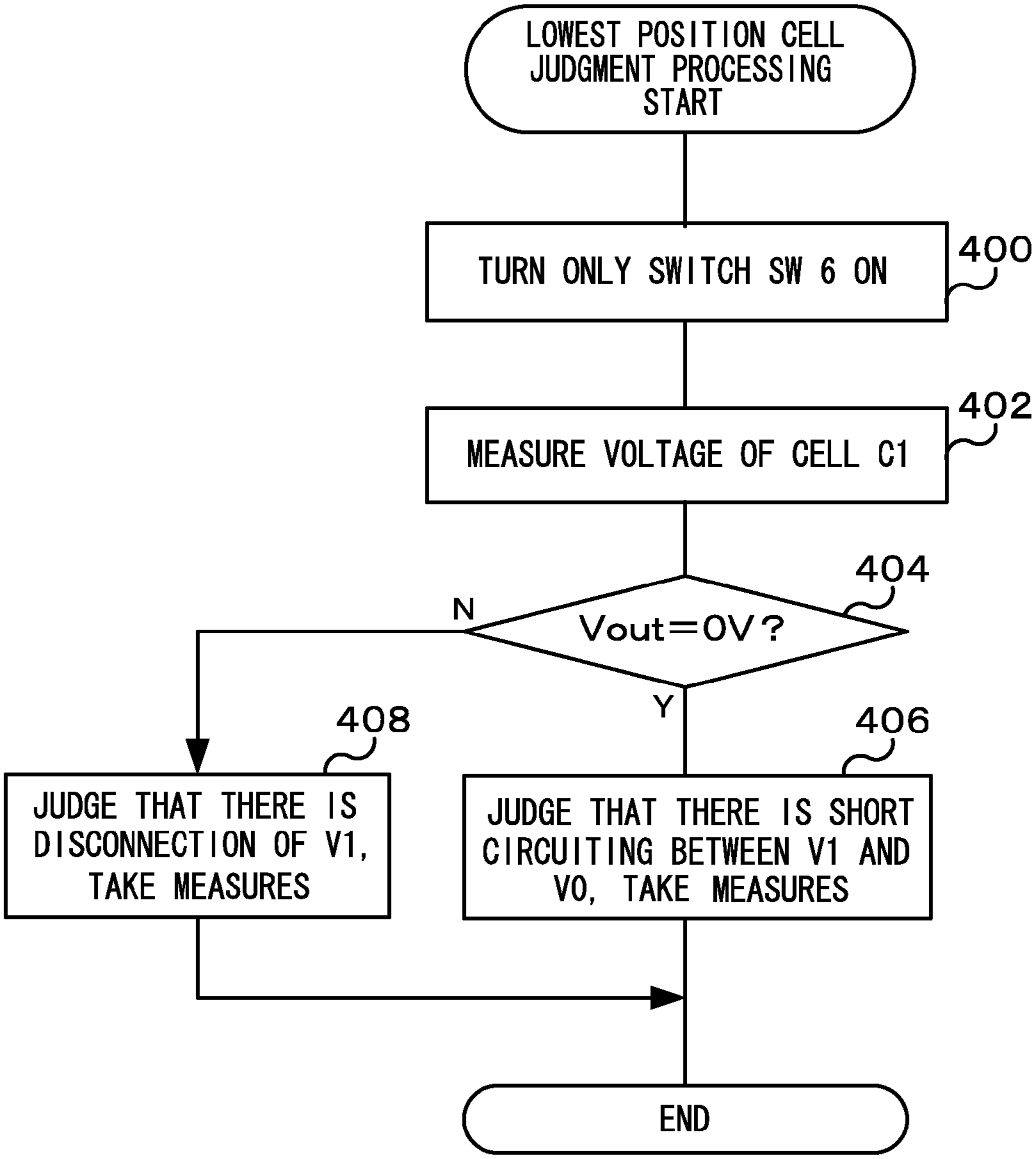
FIG. 8 is a flowchart showing an example of the flow of lowest position cell judgment processing relating to the first exemplary embodiment.

On the other hand, when it is judged that the abnormality for which judgment is impossible has arisen at the lowest position cell C (cell C1), i.e., when it is impossible to judge whether the wire V1 is disconnected or short circuiting has arisen between the wires V1 and V0, the judgment of step 200 is negative and the routine moves on to step 204. In step 204, lowest position cell judgment processing that is described in detail hereinafter is carried out, and it is judged whether the wire V1 is disconnected or there is short circuiting between wires V1 and V0, and, after measures corresponding to the results of judgment are carried out, the present processing ends. A flowchart of an example of the lowest position cell judgment processing of step 204 is shown in FIG. 8. First, in step 400, only the switch SW 6 of the voltage applying section 26 is turned on, and the voltage VREF is supplied to the wire 27 via the switch SW 6. Note that, although the voltage VREF is supplied in the present exemplary embodiment, the voltage that is supplied is not limited to this, and is not particularly limited provided that it is a voltage whose voltage value exceeds the voltage V0. Note that, if the voltage value of the voltage that is supplied is less than or equal to the voltage V0, judgment becomes impossible because the output voltage Vout of the level shifter 30 is always Vout=0 V.

In next step 402, the cell C1 is selected at the cell selection SW 20, and the voltage value (the output voltage Vout) of the cell C1 is measured. In next step 404, it is judged whether or not the output voltage Vout=0 V. If short circuiting has arisen between the wires V1 and V0, the voltage VREF is inputted to both the non-inverting terminal and the inverting terminal of the level shifter 30, and therefore, the output voltage Vout becomes Vout=0 V. On the other hand, if the wire V1 is disconnected, the voltage VREF is inputted to the non-inverting terminal of the level shifter 30 and the voltage V0 is inputted to the inverting terminal, and therefore, the output voltage Vout becomes Vout=voltage VREF−V0. Note that, when the voltage VREF−V0 exceeds the maximum output voltage 4.7 V of the level shifter 30, the output voltage Vout becomes Vout=4.7 V. Therefore, when the output voltage Vout=0 V (or a voltage value within a predetermined range from 0 V), the judgment in step 404 is affirmative, and the routine proceeds to step 406 where it is judged that there is short circuiting between the wires V1 and V0, and predetermined measures are carried out, and thereafter, the present processing ends.

On the other hand, when the output voltage Vout does not equal 0 V, the judgment in step 404 is negative. The routine moves on to step 408 where it is judged that the wire V1 is disconnected, and predetermined measures are carried out, and thereafter, the present processing ends.

As described above, at the semiconductor circuit 14 of the battery monitoring system 10 of the present exemplary embodiment, when carrying out abnormality diagnosis that judges disconnection/short circuiting of the wires V1 through V4, disconnection and short circuiting of the wires V1 through V4 are judged on the basis of the voltage values (output voltages Vout) of the respective cells C1 through C4 and the relationships of correspondence (voltage distributions) of FIG. 4 and FIG. 5 that are stored in advance in the judgment circuit 16 or the like. When it is impossible to judge whether the wire V4 is disconnected or short circuiting has arisen between the wires V4 and V3, the switch SW5 of the voltage applying section 24 is turned on, the voltage VCC is supplied to the wire 27, the voltage value (output voltage Vout) of the cell C4 is measured, and if the output voltage Vout=0V, it is judged that short circuiting has arisen between the wires V4 and V3, and if the output voltage Vout≠0 V, it is judged that the wire V4 is disconnected. On the other hand, when it is impossible to judge whether the wire V1 is disconnected or short circuiting has arisen between the wires V1 and V0, the switch SW6 of the voltage applying section 26 is turned on, the voltage VREF is supplied to the wire 27, the voltage value (output voltage Vout) of the cell C1 is measured, and if the output voltage Vout=0V, it is judged that short circuiting has arisen between the wires V1 and V0, and if the output voltage Vout≠0 V, it is judged that the wire V1 is disconnected.

In this way, in the present exemplary embodiment, it can be judged which of disconnection of the wire V4 and short circuiting between the wires V4 and V3 has arisen, and it can be judged which of disconnection of the wire V1 and short circuiting between the wires V1 and V0 has arisen, which conventionally were impossible to judge. Accordingly, disconnection and short circuiting of the wires V1 through V4 that relate to the cells C1 through C4 can be diagnosed appropriately.

Note that, in the present exemplary embodiment, when judging which of disconnection of the wire V4 and short circuiting between the wires V4 and V3 has occurred, the voltage VCC is supplied by the voltage applying section 24 to the wire 27, and, when judging which of disconnection of the wire V1 and short circuiting between the wires V1 and V0 has occurred, the voltage VREF is supplied by the voltage applying section 26 to the wire 27. However, the present invention is not limited to the same, and may be structured such that, for example, only the voltage applying section 24 is provided. In this case as well, when judging which of disconnection of the wire V1 and short circuiting between the wires V1 and V0 has occurred, the voltage VCC that is a higher voltage than the voltage V0 is supplied to the wire 27, and therefore, appropriate judgment can be carried out in the same way as described above.

Note that the present exemplary embodiment describes cases in which disconnection and short circuiting of the wires V1 through V4 are diagnosed. However, the present invention may also be applied to cases of detecting trouble with the cell selection SW 20 (a case of remaining in an on state, or a case of remaining in an off state) or the like.

Note that the present exemplary embodiment uses the level shifter 30 as a difference detecting circuit to which the high potential voltage and the low potential voltage of the cell C (C1 through C4) are inputted and that outputs the difference between the high potential voltage and the low potential voltage as the output voltage Vout. However, the present invention is not limited to the same, and the structure that is utilized is not particularly limited provided that it is a difference detecting circuit that can detect the difference between the high potential voltage and the low potential voltage.

Note that the semiconductor circuit 14 and the judgment circuit 16 may be formed on the same substrate, or may be formed on separate substrates. Further, the judgment circuit 16 may output the results of judgment to the exterior, or may store the results of judgment in the interior.

Moreover, the number of, the voltage values of, and the like of the cells C are examples, and can be changed within a scope that does not deviate from the gist of the present invention.

Second Exemplary Embodiment

A battery monitoring system (semiconductor circuit), that is a semiconductor device of a second exemplary embodiment of the present invention, and abnormality diagnosing operation that carries out judgment of disconnection/short circuiting, are described in detail hereinafter with reference to the drawings.

The first exemplary embodiment describes a case in which, when the wire V0 of the lowest position cell C1 is disconnected, the output voltage Vout when the cell C1 is read is an abnormal value of Vout=1.75 V (see FIG. 4), and therefore, disconnection of the wire V0 is thereby judged. However, there are cases in which, when an abnormality arises at the cell C1 and there is a voltage value (e.g., 1.75 V) that is lower than the set value of 3.5 V, the output voltage Vout is Vout=1.75 V even when the wire V0 is not disconnected. In this case, it cannot be judged whether the wire V0 is disconnected or a drop in voltage has arisen at the cell C1. Thus, in the abnormality diagnosis using the semiconductor circuit 14 of the present exemplary embodiment, it is further judged whether the wire V0 is disconnected or a drop in voltage has arisen at the cell C1, and appropriate abnormality diagnosis is carried out.

Note that, in the present exemplary embodiment, in addition to the abnormality diagnosis of disconnection/short circuiting of the wires V1 through V4 of the first exemplary embodiment, judgment is carried out as to whether the wire V0 is disconnected or a drop in voltage has arisen at the cell C1. Therefore, portions whose structure and operation are substantially the same as in the first exemplary embodiment are denoted by the same reference numerals to show that they are substantially the same, but detailed description thereof is omitted. The structure and operation of carrying out judgment as to whether the wire V0 is disconnected or a drop in voltage has arisen at the cell C1 are described in detail.

Figure 9:
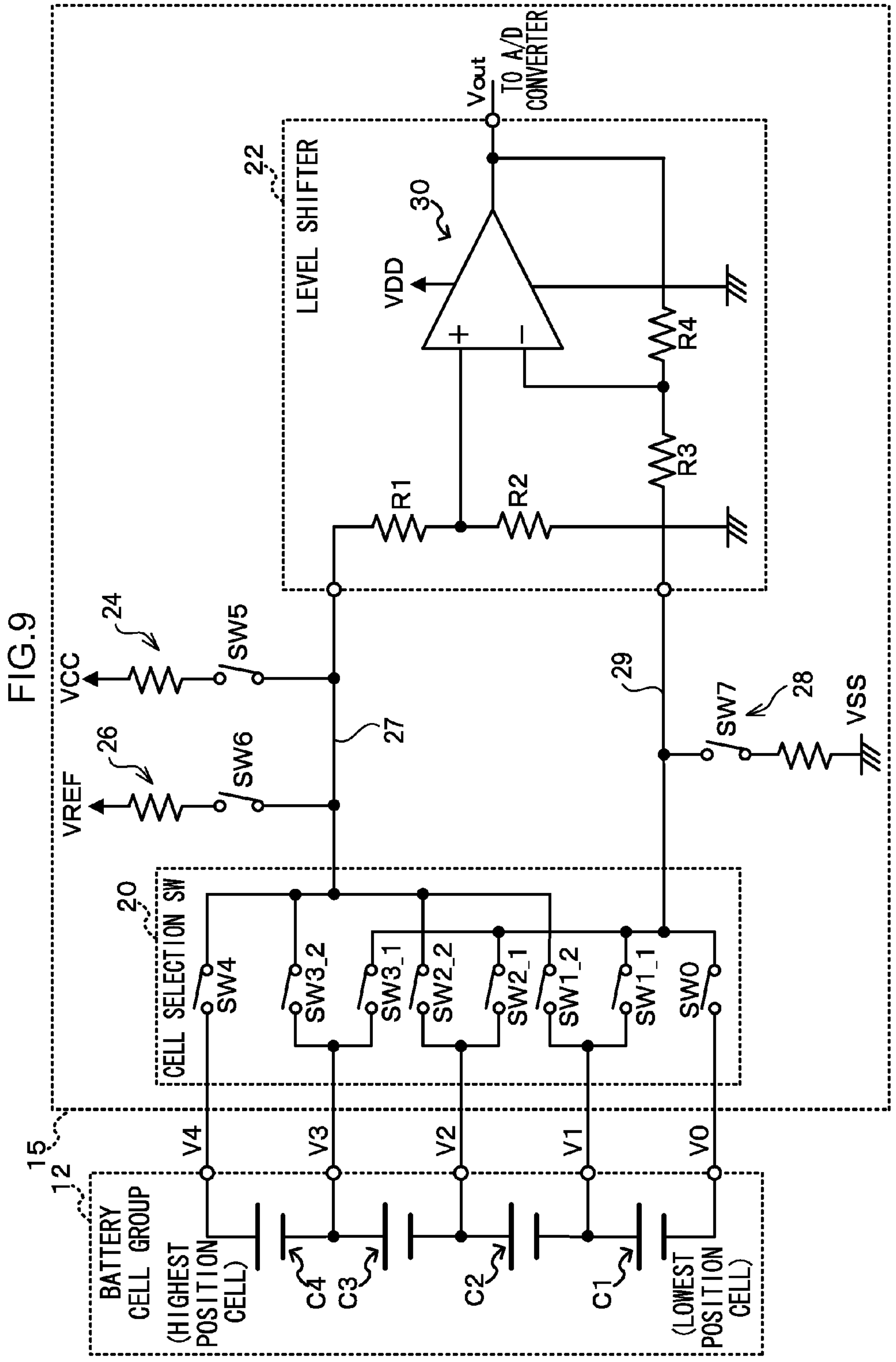
FIG. 9 is a circuit diagram showing an example of the schematic structure of a semiconductor circuit relating to a second exemplary embodiment.

Because the battery monitoring system of the present exemplary embodiment has a similar structure as the battery monitoring system 10 of the first exemplary embodiment shown in FIG. 1, description thereof is omitted here. An example of the schematic structure of a semiconductor circuit 15 of the present exemplary embodiment is shown in FIG. 9. The semiconductor circuit 15 of the present exemplary embodiment is structured to further have a voltage applying section 28 that has the function of supplying voltage VSS to a wire 29 through which the low potential voltage of the cell C (C1 through C4) is inputted to the inverting terminal of the level shifter 30. As clearly illustrated in FIG. 9, the voltage applying sections 28 is connected to the wire 29 via a node on the wire 29. The voltage applying section 28 has the function of, when judgment as to whether the wire V0 is disconnected or a drop in voltage has arisen at the cell C1 is carried out, turning a switch SW 7 on and applying the voltage VSS to the wire 27 in accordance with a control signal inputted from the judgment circuit 16. Note that, in the present exemplary embodiment, as an example, the voltage VSS is the voltage value of the low potential side of the lowest position cell (cell C1) of the battery cell group 12 (in the present exemplary embodiment, is ground level=0 V).

Because the overall flow of the abnormality diagnosing processing is similar to that of the first exemplary embodiment (see FIG. 3), detailed description is omitted here. Note that, in the present exemplary embodiment, also when the output voltage Vout of the cell C1 is Vout=1.75 V, it is judged that there is a case in which judgment is impossible.

Figure 10:
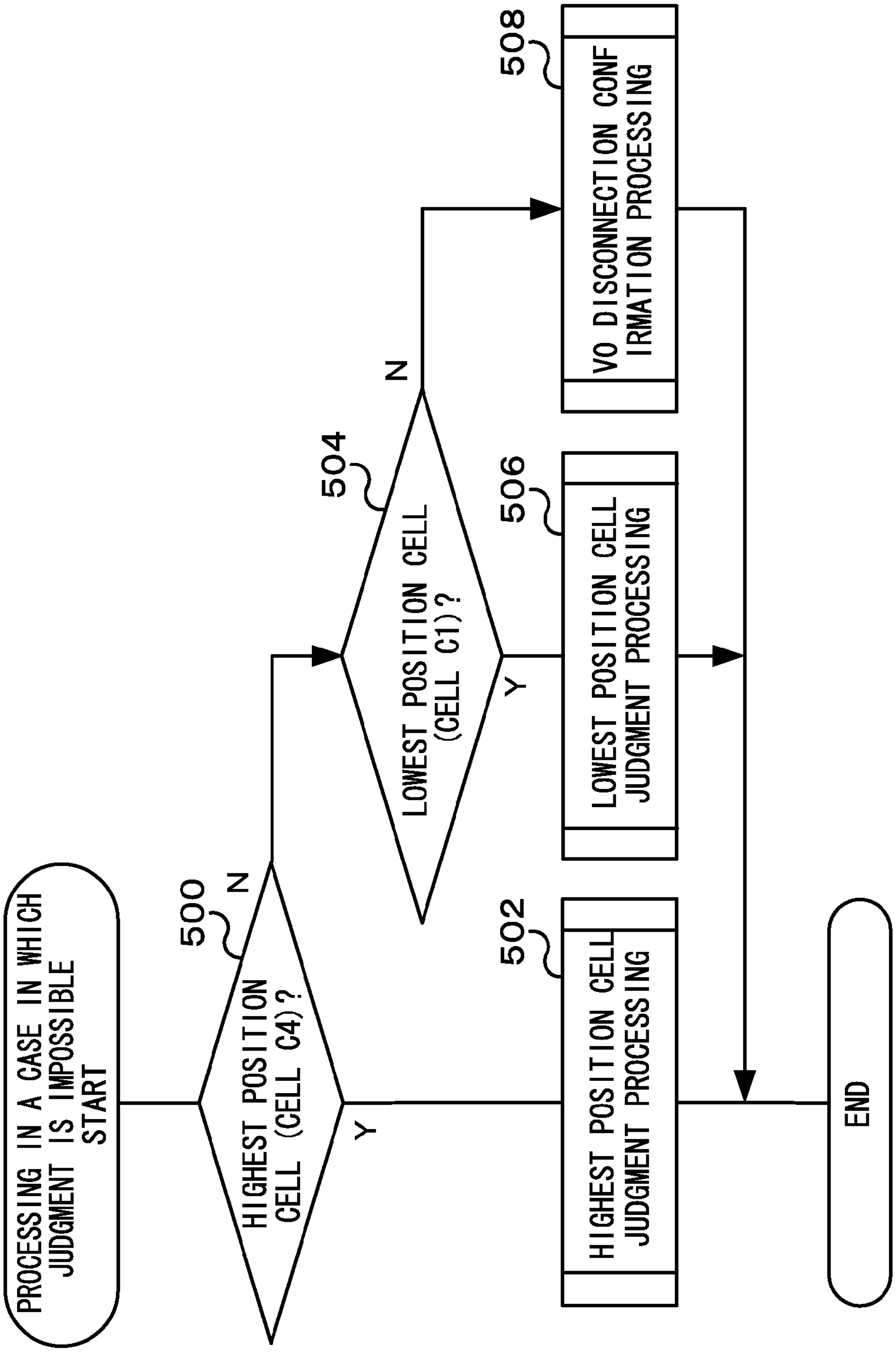
FIG. 10 is a flowchart showing an example of the flow of processing in a case in which judgment is impossible, relating to the second exemplary embodiment.

A flowchart of an example of processing in a case in which judgment is impossible in the present exemplary embodiment is shown in FIG. 10. Note that step 500 corresponds to step 200 of the first exemplary embodiment (FIG. 6). Step 502, to which the routine proceeds when the judgment in step 500 is affirmative, similarly corresponds to step 202. On the other hand, if the judgment in step 500 is negative, the routine moves on to step 504. In step 504, it is judged whether or not an abnormality has arisen at the lowest position cell C1 (an abnormality similar to the first exemplary embodiment). When the judgment in step 504 is affirmative, the routine moves on to step 506, and processing corresponding to step 204 of the first exemplary embodiment is carried out. Thereafter, the present processing ends.

On the other hand, when the judgment in step 504 is negative, the routine moves on to step 508 where wire V0 disconnection confirmation processing, that judges whether the wire V0 is disconnected or a drop in voltage has arisen at the cell C1, is carried out. Thereafter, the present processing ends.

Figure 11:
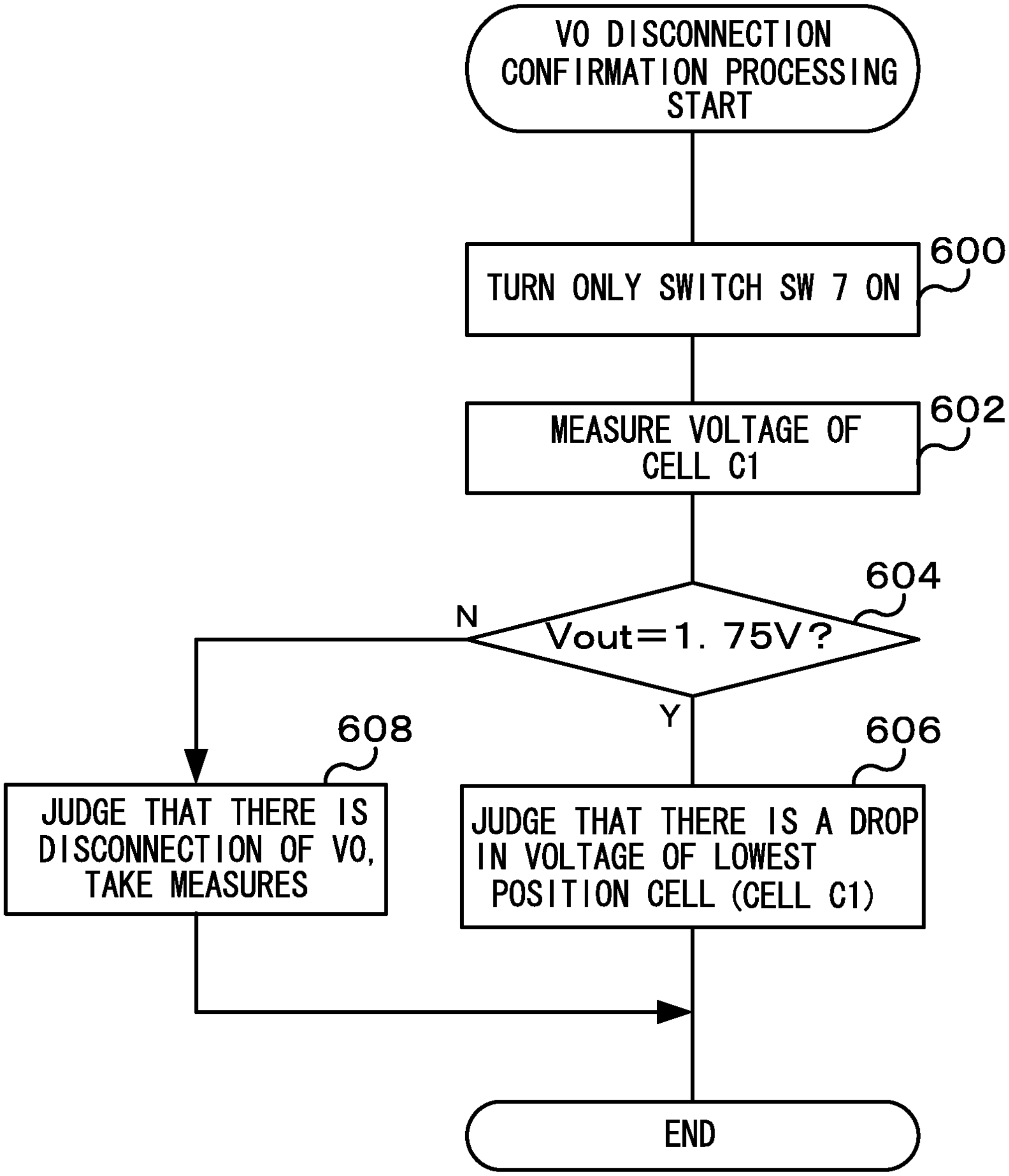
FIG. 11 is a flowchart showing an example of the flow of wire V0 disconnection confirmation processing relating to the second exemplary embodiment.
Figure 12:
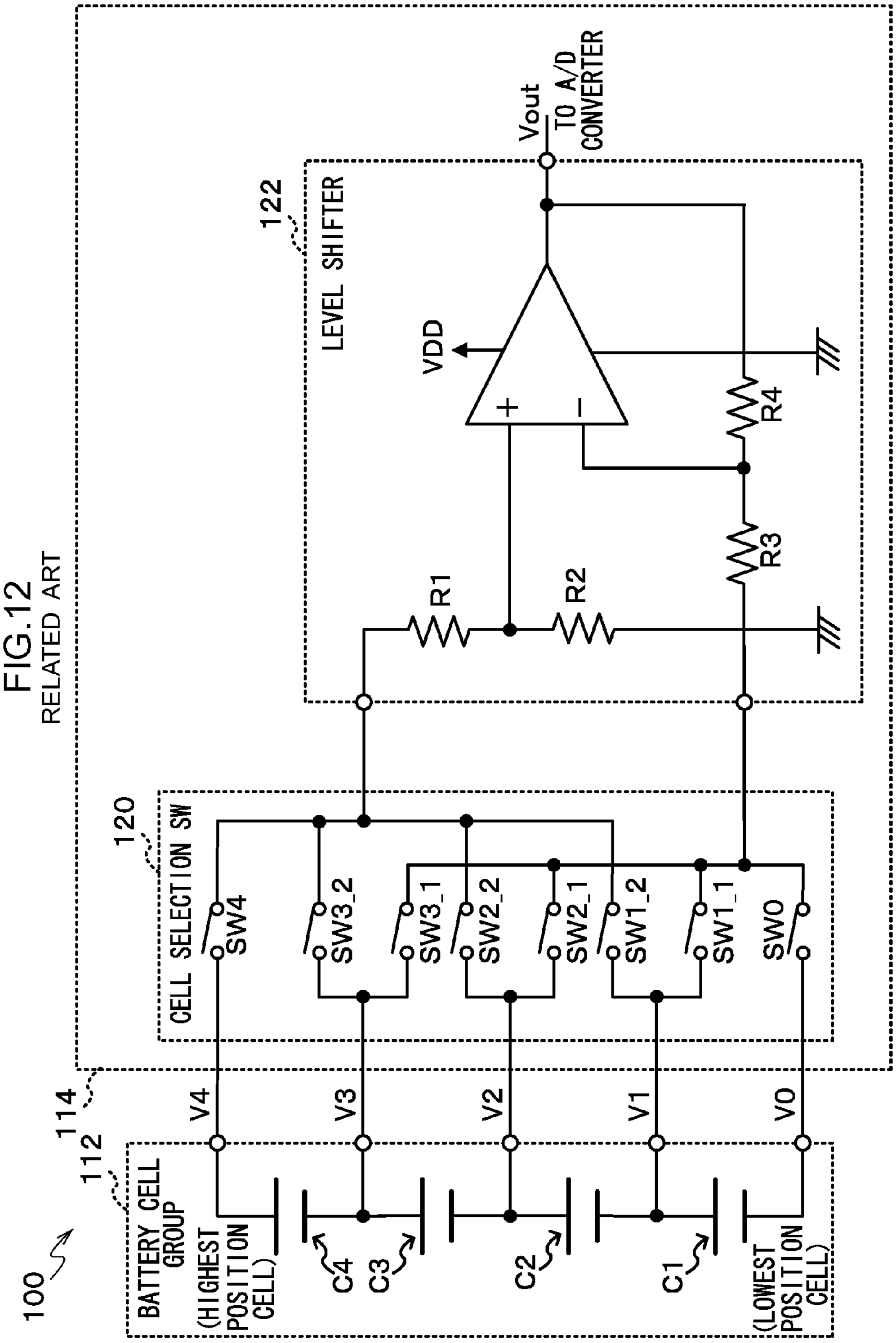
FIG. 12 is a circuit diagram showing an example of the schematic structure of a conventional battery monitoring system.

A flowchart of an example of the wire V0 disconnection confirmation processing of FIG. 508 is shown in FIG. 11. First, in step 600, the switch SW 7 of the voltage applying section 28 is turned on, and the voltage VSS is supplied to the wire 29 via the switch SW 7. Note that, although the voltage VSS is supplied in the present exemplary embodiment, the voltage that is supplied is not limited to this, and is not particularly limited provided that it is a voltage that is less than or equal to the voltage V0.

In next step 602, the cell C1 is selected at the cell selection SW 20, and the voltage value (output voltage Vout) of the cell C1 is measured. In next step 604, it is judged whether or not the output voltage Vout=1.75 V. When a drop in voltage has occurred at the cell C1 (i.e., when the voltage value is 1.75 V), the output voltage Vout becomes Vout=1.75 V. On the other hand, if the wire V0 is disconnected, the voltage V1 is inputted to the non-inverting terminal of the level shifter 30, and the voltage VSS is inputted to the inverting terminal, and therefore, the output voltage Vout becomes Vout=voltage V1−VSS=3.5 V−0 V=3.5 V. Thus, when the output voltage Vout=1.75 V (or a voltage value in a predetermined range from 1.75 V), the judgment in step 604 is affirmative, the routine proceeds to step 606 where it is judged that a drop in voltage has arisen at the cell C1, and the present processing ends.

On the other hand, when the output voltage Vout does not equal 1.75 V, the judgment in step 604 is negative, and the routine moves on to step 608 where it is judged that the wire V0 is disconnected and predetermined measures are carried out. Thereafter, the present processing ends.

As described above, at the semiconductor circuit 15 of the battery monitoring system 10 of the present exemplary embodiment, when carrying out abnormality diagnosis that judges whether the wire V0 is disconnected or a drop in voltage has occurred at the cell C1, the switch SW7 of the voltage applying section 28 is turned on, the voltage VSS is supplied to the wire 29, and the voltage value (output voltage Vout) of the cell C1 is measured. When the output voltage Vout=1.75 V, it is judged that there is a drop in voltage at the cell C1. When the output voltage Vout≠1.75 V, it is judged that the wire V0 is disconnected.

In this way, in the present exemplary embodiment, it can be judged whether the wire V0 is disconnected or a drop in voltage has arisen at the cell C1. Accordingly, disconnection and short circuiting of the wires V1 through V4 that relate to the cells C1 through C4 can be diagnosed appropriately.

What is claimed is:

1. A semiconductor circuit, comprising:

a selection circuit connected to a plurality of serially-connected batteries for selecting any of the plurality of batteries, the selection circuit having first and second output terminals for respectively outputting a high potential voltage and a low potential voltage of any selected battery, the low potential voltage being lower than the high potential voltage;

a difference detecting circuit having first and second input terminals that are respectively in electrical connection with the first and second output terminals of the selection circuit, the difference detecting circuit being configured to receive the high and low potential voltages via the first and second input terminals and to output a difference between the high potential voltage and the low potential voltage;

a wire connecting the first output terminal of the selection circuit and the first input terminal of the difference detecting circuit; and a voltage applying unit connected to the wire via first and second nodes on the wire, the voltage applying unit including a first voltage applying unit for applying a first diagnostic voltage to the wire via the first node, and a second voltage applying unit for applying a second diagnostic voltage to the wire via the second node.

2. The semiconductor circuit, comprising a low-position battery disconnection diagnosis voltage applying unit configured to apply, to another wire connecting the second output terminal of the selection circuit and the second input terminal of the difference detecting circuit, via a node on the another wire, a third diagnostic voltage for diagnosing a disconnection abnormality of the battery of the lowest voltage position among all batteries.

3. The semiconductor circuit of claim 1, comprising an abnormality diagnosing circuit that diagnoses abnormality using the first or second diagnostic voltage and the difference between the high potential voltage and the low potential voltage that is outputted from the difference detecting circuit.

4. The semiconductor circuit of claim 1, wherein the difference detecting circuit is a level shifter having a non-inverting terminal and an inverting terminal, the non-inverting and inverting terminals respectively being the first and second input terminals.

5. The semiconductor circuit, wherein the first diagnostic voltage is greater than the low potential voltage of the battery of the highest voltage position among all batteries when diagnosing an abnormality of the battery of the highest voltage position; and the second diagnostic voltage is greater than the low potential voltage of the battery of the lowest voltage position among all batteries when diagnosing an abnormality of the battery of the lowest voltage position.

6. The semiconductor circuit of claim 2, wherein the third diagnostic voltage is less than or equal to the low potential voltage of the battery of the lowest voltage position.

7. A method of diagnosing connection abnormality in a semiconductor circuit having:

a selection circuit connected to a plurality of serially-connected batteries for selecting any of the plurality of batteries, the selection circuit having first and second output terminals for respectively outputting a high potential voltage and a low potential voltage of any selected battery, the low potential voltage being lower than the high potential voltage;

a difference detecting circuit having first and second input terminals that are respectively in electric connection with the first and second output terminals of the selection circuit, the difference detecting circuit being configured to receive the high and low potential voltages via the first and second input terminals and to output a difference between the high potential voltage and the low potential voltage;

a wire connecting the first output terminal of the selection circuit and the first input terminal of the difference detecting circuit;

a voltage applying unit connected to the wire via first and second nodes on the wire, the voltage applying unit including first and second voltage applying units for respectively applying first and second diagnostic voltages to the wire via the first and second nodes; and an abnormality diagnosing circuit that diagnoses abnormality using the first or second diagnostic voltage and the difference between the high and low potential voltages that is outputted from the difference detecting circuit, the method comprising:

selecting, by the selection circuit, the battery of the highest voltage position among all batteries;

applying the first diagnostic voltage by the first voltage applying unit to the wire;

outputting, from the difference detecting circuit, a first difference between the high potential voltage and the low potential voltage of the battery of the highest voltage position;

diagnosing, by the abnormality diagnosing circuit, abnormality of a connection between the battery of the highest voltage position and the selection circuit using the outputted first difference;

selecting, by the selection circuit, the battery of the lowest voltage position among all batteries;

applying the second diagnostic voltage by the second voltage applying unit to the wire;

outputting, from the difference detecting circuit, a second difference between the high potential voltage and the low potential voltage of the battery of the lowest voltage position; and diagnosing, by the abnormality diagnosing circuit, abnormality of a connection between the battery of the lowest voltage position and the selection circuit using the outputted second difference.

8. A non-transitory computer readable storage medium that stores an abnormality diagnosing program for causing a computer to execute a process for diagnosing connection abnormality of a semiconductor circuit that has:

a selection circuit connected to a plurality of serially-connected batteries for selecting any of the plurality of batteries, the selection circuit having first and second output terminals for respectively outputting a high potential voltage and a low potential voltage of any selected battery, the low potential voltage being lower than the high potential voltage;

a difference detecting circuit having first and second input terminals that are respectively in electric connection with the first and second output terminals of the selection circuit, the difference detecting circuit being configured to receive the high and low potential voltages via the first and second input terminals and to output a difference between the high potential voltage and the low potential voltage;

a wire connecting the first output terminal of the selection circuit and the first input terminal of the difference detecting circuit;

a voltage applying unit connected to the wire via first and second nodes on the wire, the voltage applying unit including first and second voltage applying units for respectively applying first and second diagnostic voltages to the wire via the first and second nodes; and an abnormality diagnosing circuit that diagnoses abnormality using the first or second diagnostic voltage and the difference between the high and low potential voltages that is outputted from the difference detecting circuit, the process comprising:

selecting, by the selection circuit, the battery of the highest voltage position among all batteries;

applying the first diagnostic voltage by the first voltage applying unit to the wire;

outputting, from the difference detecting circuit, a first difference between the high potential voltage and the low potential voltage of the battery of the highest voltage position;

diagnosing, by the abnormality diagnosing circuit, abnormality of a connection between the battery of the highest voltage position and the selection circuit using the outputted first difference;

selecting, by the selection circuit, the battery of the lowest voltage position among all batteries;

applying the second diagnostic voltage by the second voltage applying unit to the wire;

outputting, from the difference detecting circuit, a second difference between the high potential voltage and the low potential voltage of the battery of the lowest voltage position; and diagnosing, by the abnormality diagnosing circuit, abnormality of a connection between the battery of the lowest voltage position and the selection circuit using the outputted second difference.

* * * * *